United States Patent [19]
Okabe et al.

[11] Patent Number: 5,510,634
[45] Date of Patent: Apr. 23, 1996

[54] INSULATED GATE BIPOLAR TRANSISTOR

[75] Inventors: Naoto Okabe, Chita; Naohito Kato, Kariya, both of Japan

[73] Assignee: Nippondenso Co., Ltd., Kariya, Japan

[21] Appl. No.: 324,508

[22] Filed: Oct. 18, 1994

[30] Foreign Application Priority Data

Oct. 18, 1993 [JP] Japan .................. 5-285922

[51] Int. Cl.[6] .......................... H01L 29/74; H01L 23/58
[52] U.S. Cl. .................. 257/139; 257/490; 257/491; 257/494
[58] Field of Search .................. 257/335, 337, 257/339, 341, 342, 345, 401, 173, 355, 362, 487, 488, 490, 491, 493, 494, 495, 483, 484

[56] References Cited

U.S. PATENT DOCUMENTS

| | | | |
|---|---|---|---|
| 4,364,073 | 12/1982 | Becke et al. | 257/341 |
| 4,400,716 | 8/1983 | Tani et al. | 257/495 |
| 4,443,931 | 4/1984 | Baliga et al. | 257/139 |
| 4,707,719 | 11/1987 | Whight | 257/495 |
| 5,014,101 | 5/1991 | Finney | 257/139 |
| 5,223,919 | 6/1993 | Whight et al. | 257/495 |

FOREIGN PATENT DOCUMENTS

| | | | |
|---|---|---|---|
| 380249 | 8/1990 | European Pat. Off. | |
| 0917570 | 11/1991 | European Pat. Off. | 257/139 |

*Primary Examiner*—Wael M. Fahmy
*Attorney, Agent, or Firm*—Cushman, Darby & Cushman

[57] ABSTRACT

An IGBT chip includes a unit cell region and a guard ring region which surrounds the unit cell region. In the unit cell region, a plurality of IGBT unit cells are formed, each of which comprises a base layer, a source layer, a common gate electrode, a common source electrode, and a common drain electrode. In the guard ring region, at least one diffused layer making up a guard ring is formed. Further, an annular diffused layer is formed and is connected to the drain electrode. The annular diffused layer is disposed away from the outermost guard ring by a specified length. This length is such that the punch-through occurs before the avalanche breakdown voltage of the junction associated with the outermost guard ring. Therefore, the withstand voltage against the avalanche breakdown when surge voltage is applied to the drain electrode is improved.

27 Claims, 3 Drawing Sheets

INSULATED GATE BIPOLAR TRANSISTOR

CROSS REFERENCE TO RELATED APPLICATION

This application claims the benefit of priority of the prior Japanese application No. 5-285922 filed on Oct. 18, 1993, the contents of which are incorporated herein by reference.

BACKGROUND OF THE INVENTION

1. Field of the Invention

The present invention relates to an insulated gate bipolar transistor (hereinafter referred to as "IGBT") utilized as a power switching element for high voltage and heavy current. More particularly, the present invention relates to the IGBT with a guard-ring structure.

2. Description of the Related Art

An IGBT element, while having a configuration similar to a power MOSFET, has a pn junction disposed in a drain region. Therefore, the conductivity of a highly resistive drain layer is modulated during operation so that the IGBT element can achieve both a high withstand voltage and a low ON resistance, which are impossible for the power MOSFET to achieve. A guard ring structure is used as a high voltage withstand means in the periphery of an IGBT cell region. The guard ring structure surrounds the IGBT cell region and helps improve withstanding voltage because distribution of the electrical field becomes a step-like configuration. FIG. 3 shows a main cross-sectional view of a conventional IGBT element with a guard ring structure.

In FIG. 3, when a surge voltage is applied between drain electrode 1 and source electrode 9, pn junction 2 defined between p base layer 7 and n⁻ drain layer 3 is brought into a reverse biased condition, so that a depletion layer (not shown) propagates in n⁻ drain layer 3. In the middle portion of the cell region A where p base layer 7 and n⁺ source layer 8 are plurally disposed, the depletion layers not shown) extend from the adjacent p base layers 7 toward n⁻ drain layer 3, which is situated between the adjacent p base layers 7, and connect with each other so that the electrical field relaxes. Accordingly, the electric field in the middle portion of the cell region A is settled by the maximum value $E_A$ at a flat portion of pn junction 2, i.e., the bottom portion of p base layer 7.

On the other hand, in the peripheral portion of the cell region A, because repetition of p base layers 7 stops, the above-mentioned effect of relaxing the electric field, which is obtained in the middle portion of the cell region A, is not obtained in the peripheral portion of the cell region A. Therefore, the electric field in the peripheral portion of the cell region A is settled by the maximum value $E_B$ at the corner portion of the peripheral p base layer or at a surface of n⁻ drain layer 3 proximate to the peripheral p base layer. Generally, $E_B$ is larger than $E_A$. That is to say, the withstand voltage in the peripheral portion of the cell region A is smaller than that in the middle portion of the cell region A. Thus, the withstand voltage as the IGBT element is determined by this smaller withstand voltage in the peripheral portion of the cell region A.

To increase the withstand voltage in the peripheral portion of the cell region A, at region B, which is outside the circumferential portion of the cell region A, a plurality of p layers 6', 6 are disposed known as a guard ring 6. The guard ring structure is generally provided so as to reduce the maximum electrical field intensity $E_B$ to $E_A$ by disposing one or more p islands at the surface of n⁻ drain layer 3 in region B. In addition to guard ring 6, a metal film 18, or a field plate, may be provided on n⁻ drain layer 3. The metal film 18 making up field plate contacts guard ring 6 and spreads on a insulating film formed on n⁻ drain layer 3. FIG. 3 shows the situation where field plate 18 is also included.

In this arrangement, when the surge voltage is applied to drain electrode 1 so that the maximum electrical field intensity $E_B$ in the guard ring region B reaches a critical electrical field intensity which causes an avalanche breakdown, a great number of electron-hole pairs is generated, one carrier flows into source electrode 9, and another carrier flows into p⁺ drain layer 4. The current which flows in the IGBT element, at this time, partially concentrates in the guard ring region B. Further, as the carrier which flowed into p⁺ drain layer 4 allows for a new injection of minority carriers into n⁻ drain layer 3, a larger current flows, and the current density in the guard ring region B is larger, so that breakdown occurs due to the localized heavy current and the concentrated electric field. This is why large withstand voltages against an avalanche breakdown cannot be obtained. That is, when a high surge voltage is applied to drain electrode 1 of the IGBT element, even though the guard ring structure is provided as shown in FIG. 3, an avalanche breakdown occurs in the guard ring region B and surge energy is locally applied, which thereby leads to destruction of the IGBT element. The withstand voltage against the avalanche breakdown is improved by deepening the depth of the diffused layer making up guard ring 6, which is disposed in region B, or by increasing the number of diffused layers making up the guard ring 6.

However, because deepening the depth of the diffused layer making up guard ring 6 of the IGBT element makes the lateral diffusion length increase, the guard ring region area needs to be expanded. Moreover, as diffused layers making up guard ring 6 in region B are generally formed at the same time with deep p well layers, which constitute p base layer 7 in the cell region A, so as not to increase the number of photolithographic processes, problems are caused, such as the width of the deep p well layer in the cell region A increases and the chip area is also increased. Further, multiplying the number of diffused layers making up guard ring 6 disposed in region B increases the area of guard ring region and leads to expansion of chip area.

SUMMARY OF THE INVENTION

The present invention is made in view of the above problems, and an object is to provide an IGBT element which can improve the withstand voltage in the guard ring portion when applying the surge voltage without a large increase of the chip area of IGBT element.

To accomplish the above object, an IGBT according to the present invention comprises a first semiconductor layer of a first conductivity type at the side of a drain electrode, a second semiconductor layer of a second conductivity type disposed on the first semiconductor layer and causing conductivity modulation by the injection of a carrier, a third semiconductor layer of the first conductivity type selectively formed at a surface of the second semiconductor layer, a fourth semiconductor layer of the second conductivity type selectively formed at a surface of the third semiconductor layer, the third semiconductor layer being between the second and fourth semiconductor layers and serving as a channel region and formed with a gate electrode interposing a gate insulating film therebetween, a source electrode in contact with both the third and fourth semiconductor layers, a high withstand voltage structure for reducing the curvature of a depletion layer which extends from a pn junction between the second and third semiconductor layers towards the inside of the second semiconductor layer when the pn junction is reverse biased, a diffused layer of the first conductivity type formed at the surface of the second semiconductor layer and located so as to interpose the high withstand voltage structure between the third semiconductor layer and the diffused layer, a distance between the high withstand voltage structure and the diffused layer being such that the depletion layer extending from the pn junction via the high withstand voltage structure reaches the diffused layer prior to the generation of avalanche breakdown in the vicinity of the high withstand voltage structure, and a connecting member for electrically connecting the diffused layer to the drain electrode.

Preferably, the high withstand voltage structure is constituted of a fifth semiconductor layer of the first conductivity type formed at the surface of the second semiconductor layer to form a diffused guard ring.

In this arrangement, the depletion layer is initially associated with the third semiconductor layer, and extends outward with increasing reverse bias. The high withstand voltage structure forces the curvature of the depletion layer into the shape which can avoid edge breakdown resulting from its sharp curvature. In a case where the high withstand voltage structure is made up of the diffused guard ring, i.e., the fifth semiconductor layer of the first conductivity type, the maximum electric field across the pn junction between the third and second semiconductor layers is limited, and any further increase in reverse voltage applied to the drain electrode is taken up by the fifth semiconductor layer. When the fifth semiconductor layer is plurally provided, the device breaks down at the outermost fifth semiconductor layer junction. However, according to the present invention, because the diffused layer which is electrically connected to the drain electrode is disposed away from the third semiconductor layer interposing the high withstand voltage structure, e.g. the fifth semiconductor layer, therebetween and the length between the high withstand voltage structure and the diffused layer is adjusted to a predetermined value, the depletion layer extending from the high withstand voltage structure, or the most outer fifth semiconductor layer, reaches the diffused layer at a voltage lower than a voltage causing an avalanche breakdown in the vicinity of the outermost fifth semiconductor layer. In other words, before the drain voltage reaches the critical electric field intensity causing the avalanche breakdown in the vicinity of the high withstand voltage structure, the depletion layer punches through to the diffused layer. Accordingly, the increase in the electric field is controlled, the generation of the avalanche breakdown is restrained, and the withstand voltage against the avalanche breakdown is improved.

According to the present invention, as the diffused layer which is connected to the drain electrode is disposed with the specified length away from the high withstand voltage structure, the IGBT element, which improves the withstand voltage in the high withstand voltage structure when applying surge voltage, can be provided.

BRIEF DESCRIPTION OF THE DRAWINGS

Other objects, features and characteristics of the present invention will be appreciated from a study of the following detailed description, the appended claims, and drawings, all of which form a part of this application. In the drawings:

DETAILED DESCRIPTION OF THE PREFERRED EMBODIMENTS

The present invention will now described in more detail by way of examples for an n-channel type IGBT element employing p⁻ and n⁻ types as the first and second conductivity types, respectively.

Figure 1:
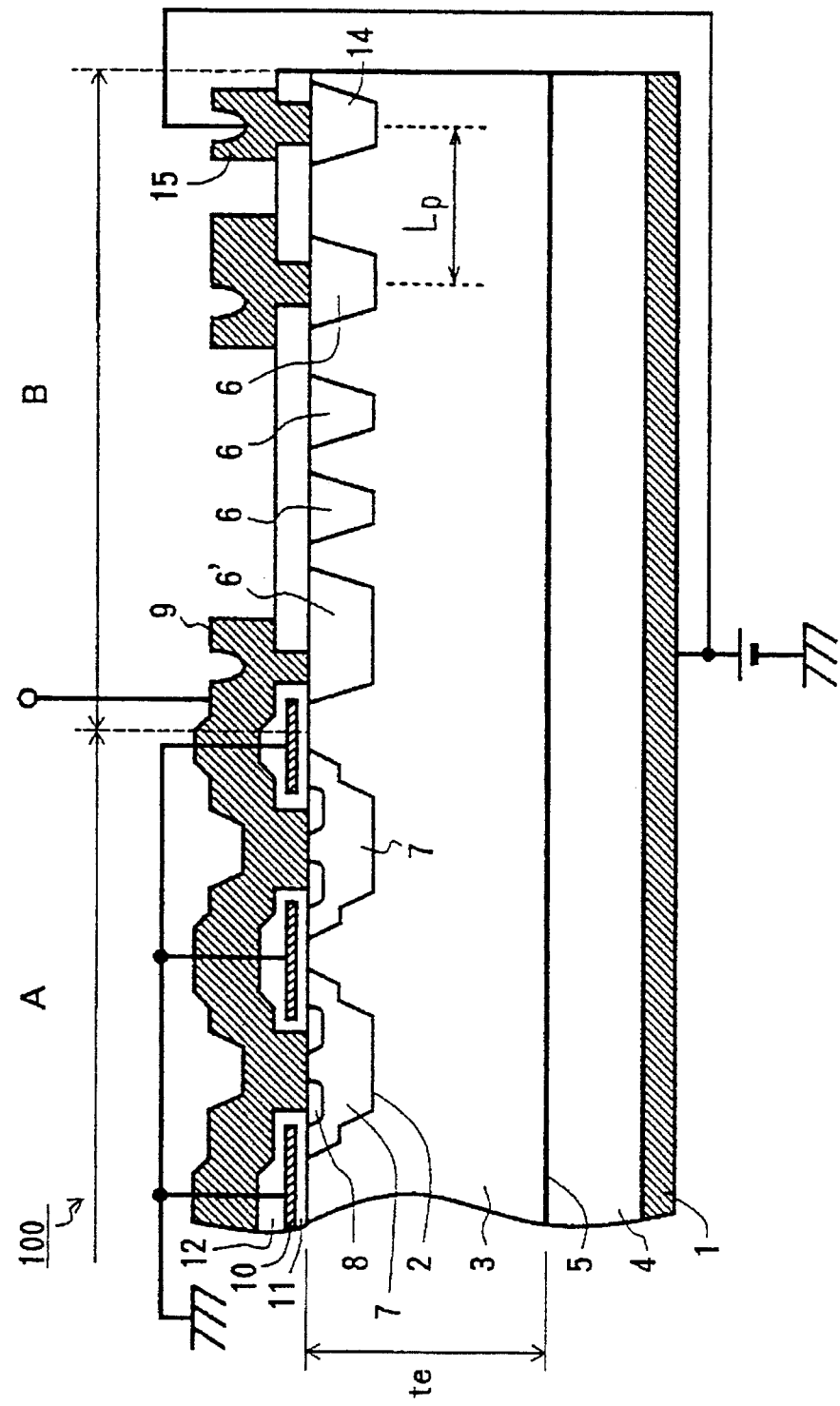
FIG. 1 is a sectional view showing a unit cell region and an outer peripheral guard ring region of the first embodiment of an IGBT according to the present invention.

FIG. 1 shows a cross-sectional view of a unit cell region A and a high withstand voltage region B of IGBT chip 100 according to the present invention. The unit cell region A is located at a central portion of the IGBT chip 100. The high withstand voltage region B is located at the peripheral portion of the IGBT chip 100 so as to surround the unit cell region A. In the unit cell region A, a plurality of IGBT unit cells are formed, each of which comprises p base layer 7, n⁺ source layer 8, gate electrode 10 common to the unit cells, source electrode 9 common to the unit cells, and drain electrode 1 common to the unit cells. In the high withstand voltage region B, at least one diffused guard ring is formed, i.e., p guard ring layers 6', 6. Furthermore, annular diffused p layer 14, which is connected to drain electrode 1 via external wiring, is disposed with specified length $L_p$ separating layer 14 from the outermost p guard ring layer 6.

The IGBT is fabricated in the following process. First, a semiconductor substrate or p⁺ drain layer 4 (first semiconductor layer) is prepared. A high resistivity n⁻ drain layer 3 (second semiconductor layer) with a predetermined impurity concentration $N_D$ and layer thickness $t_e$ ($\gg 6$ μm) is then formed by a vapor phase epitaxy method. A plurality of deep p well layers which constitute p base layers 7 (third semiconductor layer) with channel p well layers (described below), p guard ring layers 6', 6 (fifth semiconductor layer), and annular diffused p layer 14 (sixth semiconductor layer) are simultaneously formed to a depth of 3 μm to 6 μm by a localized diffusion method. The p layers 6 form guard ring structure, and p layer 6' contacts source electrode 9. Thus, p base layers 7, p guard ring layers 6', 6 and annular diffused p layer 14 have the same junction depth.

The annular diffused p layer 14 is disposed where a depletion layer reaches p layer 14 from the outermost p guard ring layer 6 at a charge voltage lower than a voltage that applies a critical electric field causing avalanche breakdown at or in the vicinity of guard ring region when a voltage is applied between drain electrode 1 and source electrode 9 to propagate the depletion layer from pn junction 2 between the most peripheral p base layer 7 and n⁻ drain layer 3 toward the guard ring region. The position where annular diffused p layer 14 is disposed, that is the length from the edge of outer peripheral guard ring layer 6, is determined by the concentration $N_D$ of n⁻ drain layer 3 mainly and concentration $N_p$ of p layer 6 and is approximately ten μm to about a hundred μm.

Next, n⁺ source layers 8 (fourth semiconductor layer) are formed in each p base layer 7 by a localized diffusion method. It should be noted that, during the above-mentioned manufacturing process, the n⁻ drain layer 3 is oxidized in the surface portion to form gate oxide film 11, on which a gate electrode 10 is then formed of a polycrystalline silicon material and is used as a mask for forming the above described channel p well layer constituting each p base layer 7 and n+ source layer 8 in a self-aligning manner by a DSA (Diffusion Self Alignment) process to define a channel region of each unit cell.

Thereafter, interlayer insulation film 12 such as boron phosphor silicate glass (BPSG), phosphor silicate glass (PSG) is formed. Subsequently, to provide an ohmic contact in each p base layer 7 and the n+ source layer 8, contact holes are opened through the upper oxide layer. Deposition of several μm of aluminum film and selective etching are then performed to form source electrode 9. Source electrode 9 also contacts with the innermost p guard ring layer 6'. At this time, a gate electrode pad (not shown) and metal electrode 15 for annular diffused p layer 14 are formed. Then, a metal film is deposited on the back side of the semiconductor substrate or p+ drain layer 4 to form drain electrode 1. Finally, metal electrode 15 and drain electrode 1 are electrically connected by the external wiring.

According to the thus-fabricated IGBT element 100, when a positive surge voltage is applied to drain electrode 1 (when the IGBT is biased as shown in FIG. 1), a depletion layer extends in n− drain layer 3 because of reverse bias at pn junction 2 between p base layer 7 and n− drain layer 3. In the central portion of unit cell region A, depletion layers extend from the adjacent p base layers 7 toward the interposed n− drain layer 3 and connect each other to form a flat depletion layer bottom. On the other hand, in the peripheral portion of the unit cell region A, because the repetitive pattern of p base layer 7 is ended, a depletion layer extends toward high withstand voltage region B with increases in the drain voltage or increases in the reverse bias. The diffused guard ring formed in high withstand voltage region B deforms the depletion layer edge to reduce the curvature thereof, which avoids edge breakdown resulting from its sharp curvature. The maximum electric field across pn junction 2 associated with p base layer 7 or the most inner p guard ring layer 6' is limited; any further increase in drain surge is taken up by the first p guard ring layer 6 until the depletion layer reaches to the second p guard ring layer 6, and so on. Thus the electrical field intensity $E_G$ in the vicinity of p guard ring layer 6 in high withstand voltage region B also increases with an increase in the drain voltage, and then the IGBT element is conditioned to break down at the junction associated with the outermost p guard ring layer 6. However, the edge of the depletion layer reaches annular diffused p layer 14 before the value of $E_G$ reaches the critical electrical field needed to cause an avalanche breakdown. Thus, a punch-through phenomenon occurs since annular diffused p layer 14 is connected to drain electrode 1. Due to this punch-through phenomenon, the breakdown voltage of the IGBT chip 100 is given by the distributed voltage associated with a plurality of p guard ring layers 6 in high withstand voltage region B and the punch-through voltage associated with the specified length $L_p$, the punch-through voltage being smaller than the breakdown voltage of the junction associated with the outermost p guard ring layer 6, and thus the increase of electrical field intensity in the guard ring region is controlled. Therefore, an outbreak of a high electrical field, which causes avalanche breakdown in the vicinity of the outermost p guard ring layer 6, and a large current concentration occurring in the breakdown point are prevented. Consequently, the withstand voltage against the avalanche breakdown when surge voltage is applied to drain electrode 1 is improved.

Although the first embodiment of the present invention includes the structure in which the electrical connection between annular diffused p layer 14 and drain electrode 1 is linked together with outer conductor, it may be applicable to provide a p link layer so as to connect p layer 14 with p drain layer 4 without using electrode 15 and the outer conductor.

Figure 2:
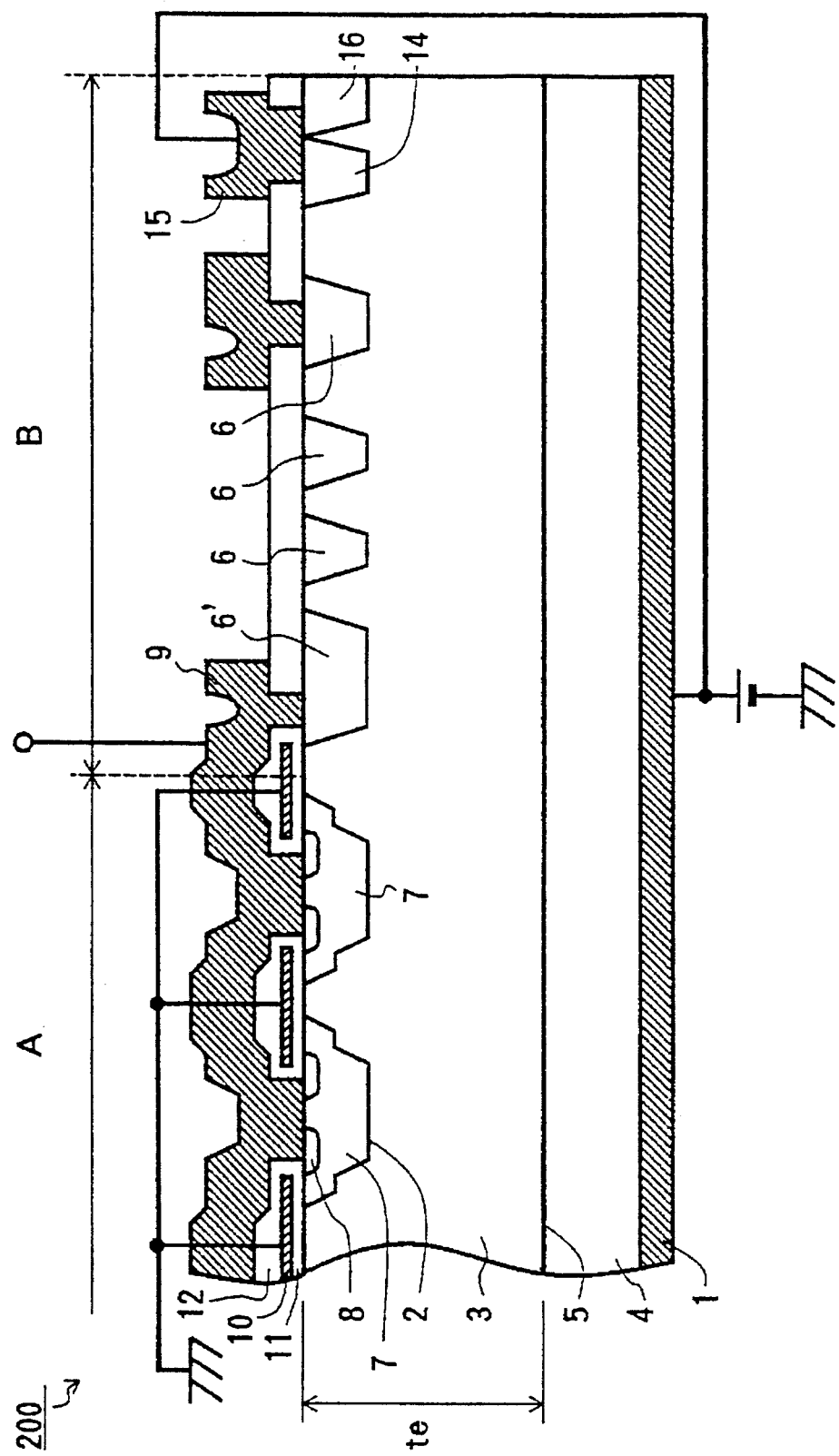
FIG. 2 is a sectional view showing a unit cell region and an outer peripheral guard ring region of the second embodiment of an IGBT according to the present invention.
Figure 3:
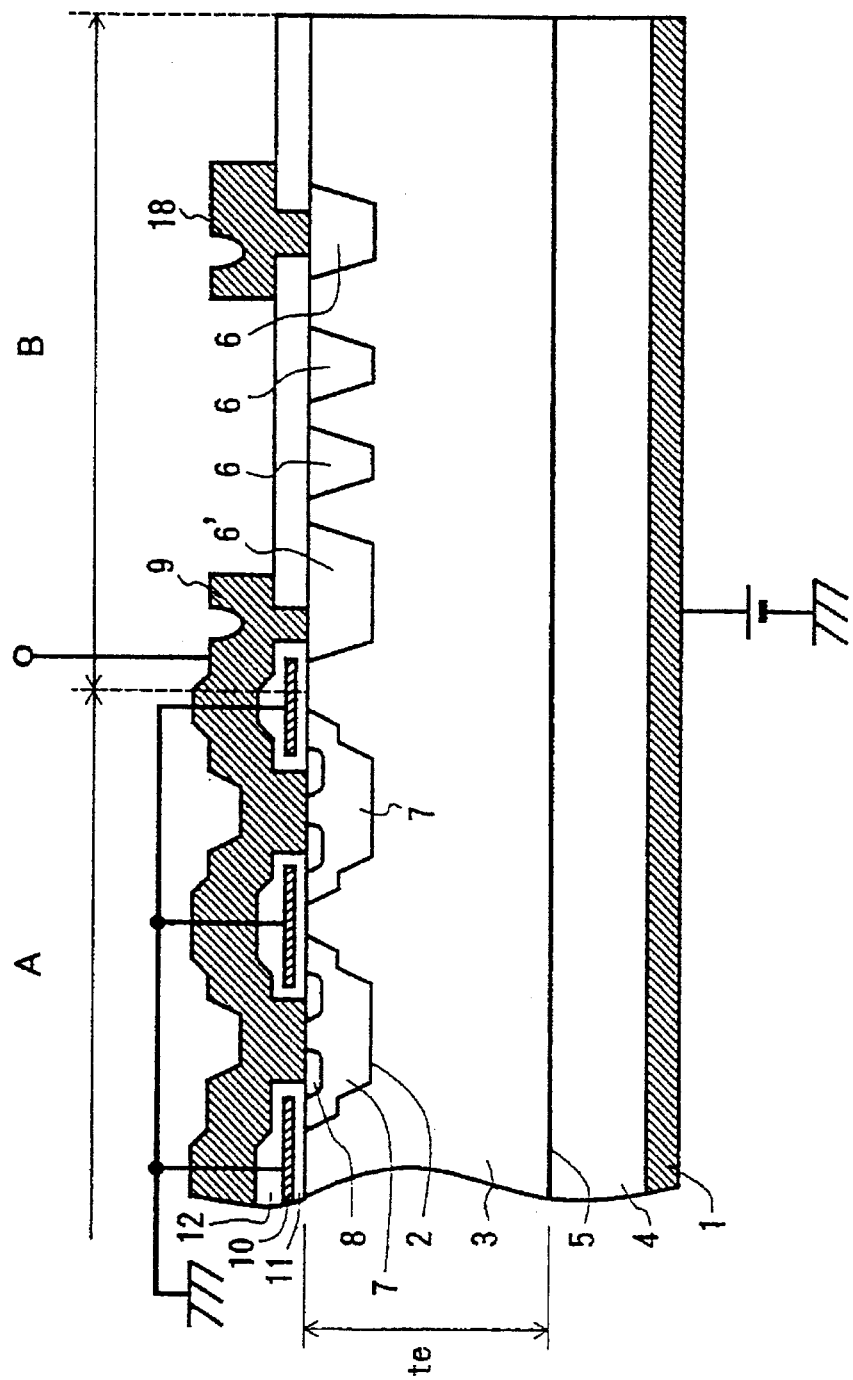
FIG. 3 is a sectional view showing a unit cell, region and an outer peripheral guard ring region of a known IGBT.

FIG. 2 shows an IGBT element 200 according to a second embodiment of the present invention. In addition to the structure of FIG. 1, the IGBT element 200 of the second embodiment includes n+ peripheral layer 16 (seventh semiconductor layer) disposed in the n− drain layer 3 in the vicinity of diffused p layer 14. The electrode 15, which electrically connects diffused p layer 14 to drain electrode 1, is also in contact with this n+ peripheral layer 16. Further, in the manufacturing process described in the first embodiment of the present invention, this n+ peripheral layer 16 can be simultaneously formed with the n+ source layer 8.

When a depletion layer extends in the n− drain layer 3 of high withstand voltage region B from p base layer 7 or p layer 6' after applying surge voltage to drain electrode 1, the electrical field intensity in high withstand voltage region B increases, thereby generating electron-hole pairs due to impact ionization. The generated electrons (majority carriers) in n− drain layer 3 of high withstand voltage region B are extracted from n+ peripheral layer 16, then flow through metal electrode 15, an external conductor, and drain electrode 1 toward the outside of the element 200. This reduces the number of electrons which reach p+ drain layer 4 to forward-bias substrate pn junction 5, so that the injection of the holes (minority carriers) from p+ layer 4 is restrained, and the current density which flows in the guard ring region is reduced. As a result, the withstand voltage against the avalanche breakdown when surge voltage is applied to drain electrode 1 is further improved.

In addition, although the above-mentioned metal electrode 15 is shown in FIG. 2 as an electrode which is in contact with both annular diffused p layer 14 and n+ peripheral layer 16, it may be applicable to provide two metal electrodes, one of which contacts with annular diffused p layer 14 and another of which contacts with n+ peripheral layer 16, and then electrically connect the two electrodes with drain electrode 1.

Although the foregoing embodiments have been described regarding the n-channel type IGBT in which the first conductivity type is p-type and the second conductivity type is n-type, the present invention can also be advantageously applied to a p-channel type IGBT in which the conductivity types are reversed.

While the present invention has been shown and described with reference to the foregoing preferred embodiments, it will be apparent to those skilled in the art that changes in form and detail may be made therein without departing from the scope of the invention as defined in the appended claims.

What is claimed is:

1. An insulated gate bipolar transistor, comprising:

a first semiconductor layer of a first conductivity type;

a second semiconductor layer of a second conductivity type disposed on said first semiconductor layer;

a third semiconductor layer of the first conductivity type selectively formed at a surface of said second semiconductor layer;

a fourth semiconductor layer of the second conductivity type selectively formed at a surface of said third semiconductor layer, said third semiconductor layer being between said second semiconductor layer and said fourth semiconductor layer and serving as a channel region;

a gate electrode disposed over said channel region with a gate insulating film interposed therebetween;

a source electrode in contact with both said third semiconductor layer and said fourth semiconductor layer;

a drain electrode for supplying a drain current through said first semiconductor layer, contacting to said first semiconductor layer;

a high withstand voltage structure for reducing the curvature of a depletion layer extending from a pn junction between said second semiconductor layer and said third semiconductor layer toward an inside of said second semiconductor layer when said pn junction is reverse biased;

a sixth semiconductor layer of the first conductivity type formed at the surface of said second semiconductor layer and located so as to make said high withstand voltage structure disposed between said third semiconductor layer and said sixth semiconductor layer, a distance between said high withstand voltage structure and said sixth semiconductor layer being such that said depletion layer extending from said pn junction via said high withstand voltage structure reaches said sixth semiconductor layer prior to a generation of avalanche breakdown in the vicinity of said high withstand voltage structure; and a connecting member for electrically connecting said sixth semiconductor layer to said drain electrode.

2. The insulated gate bipolar transistor according to claim 1, wherein said high withstand voltage structure includes a fifth semiconductor layer of the first conductivity type formed at the surface of said second semiconductor layer to form a diffused guard ring.

3. The insulated gate bipolar transistor according to claim 2, wherein said distance between said high withstand voltage structure and said sixth semiconductor layer is defined as a spacing between said fifth semiconductor layer and said sixth semiconductor layer, said spacing being determined such that said depletion layer extending via said fifth semiconductor layer punches through to said sixth semiconductor layer prior to generation of avalanche breakdown at a pn junction associated with said fifth semiconductor layer.

4. The insulated gate bipolar transistor according to claim 3, further comprising a seventh semiconductor layer of the second conductivity type for extracting a majority carrier generated in the vicinity of said fifth semiconductor layer.

5. The insulated gate bipolar transistor according to claim 4, wherein said seventh semiconductor layer is electrically connected to said drain electrode.

6. The insulated gate bipolar transistor according to claim 5, wherein said seventh semiconductor layer is disposed at the surface of said second semiconductor layer and outside of and proximate to said sixth semiconductor layer.

7. The insulated gate bipolar transistor according to claim 6, wherein said connecting member contacts said seventh semiconductor layer.

8. An insulated gate bipolar transistor comprising:

a first semiconductor layer of a first conductivity type;

a second semiconductor layer of a second conductivity type adjoining said first semiconductor layer;

a third semiconductor layer of the first conductivity type formed in said second semiconductor layer, with a junction between said second semiconductor layer and said third semiconductor layer terminating at a surface of said second semiconductor layer;

a fourth semiconductor layer of the second conductivity type formed in said third semiconductor layer, with a junction between said third semiconductor layer and said fourth semiconductor layer terminating at a surface of said third semiconductor layer;

a gate electrode formed at least over a channel region with a gate insulating film interpose therebetween said channel region defined by a surface of said third semiconductor layer in a portion between said second semiconductor layer and said fourth semiconductor layer;

a source electrode in contact with both said third semiconductor layer and said fourth semiconductor layer;

a fifth semiconductor layer of the first conductivity type formed in said second semiconductor layer to surround a region in which said third semiconductor layer is formed, with a junction between said second semiconductor layer and said fifth semiconductor layer terminating at a surface of said second semiconductor layer;

a drain electrode for supplying a drain current through said first semiconductor layer;

a sixth semiconductor layer of the first conductivity type formed in said second semiconductor layer such that a junction between said second semiconductor layer and said sixth semiconductor layer terminates at the surface of said second semiconductor layer, said sixth semiconductor layer disposed away from said fifth semiconductor layer by a length over which a depletion layer extends from a pn junction between said second semiconductor layer and said third semiconductor layer towards the inside of said second semiconductor layer and reaches said sixth semiconductor layer prior to an avalanche breakdown voltage of said junction of said fifth semiconductor layer when said pn junction is reverse biased; and a connecting member for electrically connecting said sixth semiconductor layer to said drain electrode.

9. The insulated gate bipolar transistor according to claim 8, further comprising a seventh semiconductor layer of the second conductivity type disposed proximate to said sixth semiconductor layer of the first conductivity type, and being electrically connected to said drain electrode with said sixth semiconductor layer via said connecting member.

10. An insulated gate bipolar transistor comprising:

a semiconductor substrate of a first conductivity type;

a semiconductor layer of a second conductivity type disposed on said substrate, said semiconductor layer having a first region and a second region abutting said first region;

base layers of the first conductivity type located in said semiconductor layer at a surface of said first region;

source layers of the second conductivity type located in each base layer, each base layer constituting a portion of a respective unit cell, a junction of each source layer within a corresponding base layer terminating at a surface thereof and at a distance from a junction between said corresponding base layer and said semiconductor layer;

a gate electrode located in said first region such that said gate electrode overlaps at least a channel region with a gate insulating film interposed therebetween, said channel region being defined by said distance;

a source electrode contacting both said corresponding base layer and a corresponding one of said source layers in each of said unit cells;

at least one guard ring layer of the first conductivity type located in said semiconductor layer at a surface of said second region, said guard ring layer surrounding said first region, a junction of said guard ring layer terminating at said surface of said second region;

a drain electrode contacting said substrate;

an annular diffused layer of the first conductivity type located in said semiconductor layer at said surface of said second region to surround said guard ring layer, a junction of said diffused layer terminating at said surface of said second region and at a spacing from said junction of said guard ring layer, said spacing having a length which allows a punch-through between said guard ring layer and said diffused layer before an avalanche breakdown of said junction of said guard ring layer when a depletion layer extends to said second region from a pn junction associated with said base layer adjacent a border between said first region and said second region; and external wiring for electrically connecting said diffused layer to said drain electrode.

11. The insulated gate bipolar transistor according to claim 10, further comprising a majority carrier extracting layer of the second conductivity type disposed proximate to said diffused layer of the first conductivity type, electrically connected to said drain electrode.

12. An insulated gate bipolar transistor comprising:

a unit cell region including at least one unit cell having a base layer, a source layer, a common gate electrode, a common source electrode, and a common drain electrode;

a guard ring region including at least one diffused layer forming a guard ring;

an annular region including an annular diffused layer surrounding said guard ring and spaced therefrom by a predetermined distance;

wherein said predetermined distance allows a punch-through phenomenon between said guard ring and said annular diffused layer so that no avalanche breakdown occurs at said guard ring; and wherein said annular diffused layer is electrically connected to said common drain electrode.

13. The insulated gate bipolar transistor according to claim 12, wherein said base layer is of a first conductivity type and said source layer is of a second conductivity type.

14. The insulated gate bipolar transistor according to claim 13, wherein said at least one diffused layer and said annular diffused layer are of said first conductivity type.

15. The insulated gate bipolar transistor according to claim 14, wherein said annular region includes a metal electrode contacting said annular diffused layer.

16. The insulated gate bipolar transistor according to claim 14, wherein said annular diffused layer is a p type semiconductor layer.

17. The insulated gate bipolar transistor according to claim 16, wherein said punch-through phenomenon controls increases in electric field intensity in said guard ring region and prevents generation of large electric fields therein.

18. The insulated gate bipolar transistor according to claim 12, wherein said annular diffused layer includes a diffused p layer and an n type layer disposed at an outer periphery of said player.

19. The insulated gate bipolar transistor according to claim 18, wherein said annular region includes a metal electrode contacting both said p layer and said n type layer.

20. The insulated gate bipolar transistor according to claim 18, wherein said source electrode and said n type layer are formed simultaneously.

21. An insulated gate bipolar transistor, comprising:

a first semiconductor layer of a first conductivity type;

a second semiconductor layer of a second conductivity type disposed on said first semiconductor layer;

a third semiconductor layer of the first conductivity type selectively formed at a surface of said second semiconductor layer;

a fourth semiconductor layer of the second conductivity type selectively formed at a surface of said third semiconductor layer, said third semiconductor layer being between said second semiconductor layer and said fourth semiconductor layer and serving as a channel region;

a gate electrode disposed over said channel region with a gate insulating film interposed therebetween;

a source electrode in contact with both said third semiconductor layer and said fourth semiconductor layer;

a drain electrode for supplying a drain current through said first semiconductor layer, contacting to said first semiconductor layer;

a high withstand voltage structure for reducing the curvature of a depletion layer extending from a pn junction between said second semiconductor layer and said third semiconductor layer toward an inside of said second semiconductor layer when said pn junction is reverse biased;

a sixth semiconductor layer of the first conductivity type formed at the surface of said second semiconductor layer and located between an edge of said second semiconductor layer and said high withstand voltage structure, a distance between said high withstand voltage structure and said sixth semiconductor layer being such that said depletion layer extending from said pn junction via said high withstand voltage structure reaches said sixth semiconductor layer prior to a generation of avalanche breakdown in the vicinity of said high withstand voltage structure; and a connecting member for electrically connecting said sixth semiconductor layer to said drain electrode.

22. The insulated gate bipolar transistor according to claim 21, wherein said high withstand voltage structure includes a fifth semiconductor layer of the first conductivity type formed at the surface of said second semiconductor layer to form a diffused guard ring.

23. The insulated gate bipolar transistor according to claim 22, wherein said distance between said high withstand voltage structure and said sixth semiconductor layer is defined as a spacing between said fifth semiconductor layer and said sixth semiconductor layer, said spacing being determined such that said depletion layer extending via said fifth semiconductor layer punches through to said sixth semiconductor layer prior to generation of avalanche breakdown at a pn junction associated with said fifth semiconductor layer.

24. The insulated gate bipolar transistor according to claim 23, further comprising a seventh semiconductor layer of the second conductivity type for extracting a majority carrier generated in the vicinity of said fifth semiconductor layer.

25. The insulated gate bipolar transistor according to claim 24, wherein said seventh semiconductor layer is electrically connected to said drain electrode.

26. The insulated gate bipolar transistor according to claim 25, wherein said seventh semiconductor layer is disposed at the surface of said second semiconductor layer and outside of and proximate to said sixth semiconductor layer.

27. The insulated gate bipolar transistor according to claim 26, wherein said connecting member contacts said seventh semiconductor layer.

* * * * *